United States Patent
Gustavsson et al.

[11] Patent Number: 6,160,508
[45] Date of Patent: Dec. 12, 2000

[54] METHOD AND DEVICE FOR ANALOGUE TO DIGITAL CONVERSION

[75] Inventors: Mikael Gustavsson, Linköping, Sweden; Nianxiong Tan, Eatontown, N.J.

[73] Assignee: Telefonaktiebolaget LM Ericsson, Stockholm, Sweden

[21] Appl. No.: 09/220,765

[22] Filed: Dec. 28, 1998

[30] Foreign Application Priority Data

Dec. 29, 1997 [SE] Sweden .................................. 9704895

[51] Int. Cl.$^7$ ...................................................... H03M 1/12
[52] U.S. Cl. ........................... 341/155; 341/159; 341/172
[58] Field of Search .................... 341/155, 159, 341/172

[56] References Cited

U.S. PATENT DOCUMENTS

| | | | |
|---|---|---|---|
| 4,633,226 | 12/1986 | Black, Jr. ................................ | 341/159 |
| 4,782,391 | 11/1988 | McNeely et al. ....................... | 348/565 |
| 5,247,301 | 9/1993 | Yahagi et al. ........................... | 341/156 |
| 5,272,481 | 12/1993 | Sauer ...................................... | 341/165 |
| 5,568,142 | 10/1996 | Velazquez et al. .................... | 341/155 |
| 5,585,796 | 12/1996 | Svensson et al. ...................... | 341/155 |
| 5,808,573 | 9/1998 | Shih et al. .............................. | 341/159 |
| 5,856,800 | 1/1999 | Pailleur et al. ......................... | 341/159 |

FOREIGN PATENT DOCUMENTS

| | | |
|---|---|---|
| 60-29028 | 2/1985 | Japan . |
| 60-43922 | 8/1985 | Japan . |
| 6-291660 | 10/1994 | Japan . |

OTHER PUBLICATIONS

Black. et al., "Time Interleaved Converter Arrays", IEEE Journal of Solid State Circuits, vol. SC–15, No. 6, pp. 1022–1029, Dec. 1980.

Jenq, Yih–Chyun, "Digital Spectra of Nonuniformly Sampled Signals: Fundamentals and High Speed Waveform Digitizers", IEEE T. Instrumentation and measurement, vol. 37, No. 2, pp. 245–251, Jun. 1988.

Conroy, et al., "An 8–b MS/s Parallel Pipeline A/D Converter in 1–$\mu$m CMOS", IEEE J. Solid State Circuits, vol. 28, No. 4, pp. 447–454, Apr. 1993.

*Primary Examiner*—Trong Phan
*Attorney, Agent, or Firm*—Burns, Doane, Swecker & Mathis, L.L.P.

[57] ABSTRACT

A parallel SC ADC (switched capacitor analog-to-digital converter) includes a passive sampling technique controlled by a global clock phase to reduce the influence of the sampling phase skew. Since it does not require operational amplifiers for sampling, it is very suitable for high speed applications, and yet it can reduce the sampling-phase-skew-related distortion by 20–40 dB in a high speed, parallel SC ADC.

13 Claims, 3 Drawing Sheets

METHOD AND DEVICE FOR ANALOGUE TO DIGITAL CONVERSION

The present invention relates to SC (switched-capacitor) ADCs (analogue-to-digital converters), particularly for use in wideband telecommunication applications.

BACKGROUND

In wideband telecommunication applications, there is a need for high speed analogue-to-digital converters (ADCs, or AD converters) with a high SNDR (Signal to Noise and Distortion Ratio).

By using parallelism, a fast ADC can be constructed from several slow sub-ADCs, controlled by a multi-phase clock. "Time Interleaved Converter Arrays", Black et al., IEEE Journal of Solid State Circuits, Vol SC-15, No 6, pp 1022–29, December 1980, discloses a high speed weighted capacitor ADC using parallel or time interleaving technique.

Several error sources limit the performance of parallel ADCs. Different offsets and different gains in the sub-ADCs generate distortion. Another more troublesome error source is the sampling phase skew in the parallel channels, which introduces distortion. The sampling instants must be equally spaced between two successive sub-ADCs in order to re-construct the signal in the digital domain. The difference in the distance of sampling instants between two successive sub-ADCs is called the phase skew. The phase skew arises due to the fact that the sampling instant is controlled by different clock phases in different places. Any noise and unbalanced parasitic contribute to the phase skew.

The relationship between SNDR and the phase skew has been discussed in "Digital Spectra of Nonuniformly Sampled Signals: Fundamentals and High Speed Waveform Digitizers", IEEE T. Instrumentation and measurement, Vol. 37, No 2, p 245–51, June 1988.

"An 8-b 85-Ms/s parallel Pipeline A/D Converter in 1 µm CMOS", Conroy et al., IEEE J. Solid State Circuits, Vol 28, No 4, pp 44754, April 1993, discloses a four channel ADC in CMOS with a timing mismatch approximated from measurements to be about 25 ps. This is not adequate for wideband telecommunication applications, where a high SNDR at high signal frequencies is required.

One way to overcome this is to place a track-and-hold amplifier at the input. This is not desirable in that it demands a high-gain operational amplifier driving a large capacitive load at a very high frequency.

U.S. Pat. No. 5,247,301 to Yahagi et al. discloses a two-step or sub-flash type ADC, using a common analogue input switch in series with a second analogue switch to reduce the timing error. Independent of the number of sub-converters, the clock signal for the analogue input switch has the same frequency as the control signals for all the sample-and-hold switches. All the switches are turned on by the same phase (only the turning-off of the common switch leads the turning-off of other switches). The common switch is at the input of the device, therefore, due to the implementation of the switch (e.g. a MOS transistor), the turning of instant is a function of the input voltage. Due to the charge redistribution of a MOS switch, another source of error, the charge injection error, is introduced. The signal-independent part, i.e. the charge injection caused offset voltage, can be compensated to a certain extent by using a compensator as disclosed in FIGS. 3, 4 and 5 of U.S. Pat. No. 5,247,301. But the signal-dependent charge injection error remains to be compensated for. The signal-dependent turning-off instant and signal-dependent charge injection error introduce very strong distortions in any ADC, and thus this device is not applicable to any high dynamic performance ADC.

SUMMARY

Accordingly, it is an object of the present invention to provide a solution to the problem of sampling phase skew in a parallel switched capacitor ADC.

A further object of the invention is to provide a method and a device for a high speed ADC having passive sampling and active holding, with reduced sampling phase skew induced distortion.

Another object of the invention is to provide a method and a device for a high speed parallel ADC without the need to use operational amplifiers for sampling.

Another object of the invention is to provide a method and a device to improve the timing characteristics of a high-speed parallel ADC using any type of subADC:s, while keeping a high dynamic performance.

These objects are achieved by a method and a device having the characterizing features of the independent claims. Further features and improvements of the invention, are given in the dependent claims.

According to an embodiment of the invention, a parallel switched capacitor ADC using any type of subADC:s is provided, comprising a passive sampling technique controlled by a global clock phase to reduce the influence of the sampling phase skew. The frequency of the global clock phase is M times higher than that of the channel clock phases. The channel clock phases for the individual sample-and-hold switches are skewed, so that none of the individual sample-and-hold switches turn on at the same time. The sampling instant is determined by the turning off of the common switch (controlled by the global clock phase). The signal dependency of the turning off instant and of errors due to the charge redistribution is eliminated to the first order. This makes a device according to the invention very suitable for high dynamic performance ADC:s. Further, since it does not require operational amplifiers in the sampling stage, it is very suitable for high speed applications, and yet it can reduce the sampling-phase-skew-related distortion by 20–40 dB in a high speed, parallel SC ADC.

BRIEF DESCRIPTION OF THE DRAWINGS

For a more complete understanding of the present invention and for further objects and advantages thereof, reference is now made to the following description of a non-exclusive example of embodiments taken in conjunction with the accompanying drawings, in which.

DETAILED DESCRIPTION

Figure 1:
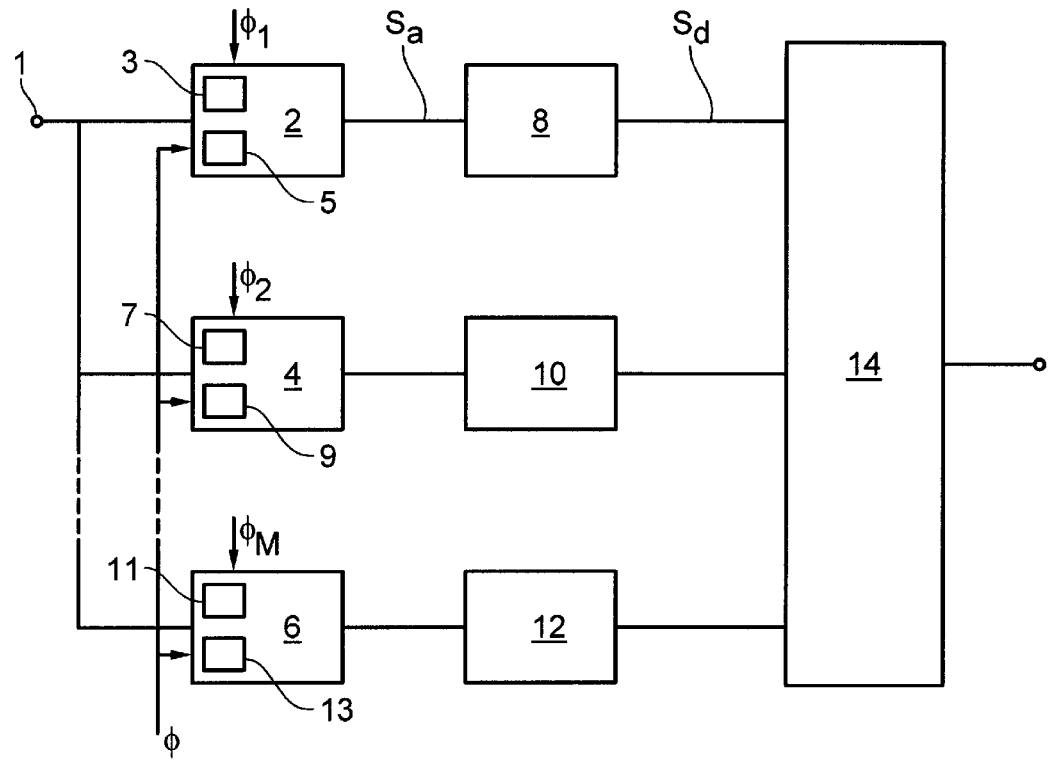
FIG. 1 shows a block diagram of a parallel ADC according to a first embodiment of the invention.

The invention will now be described by way of a embodiments, which are a non-exclusive example thereof, with reference to the accompanying drawings, wherein identical reference characters designate identical or like parts.

FIG. 1 shows a block diagram of an M channel parallel ADC, according to a first embodiment of the invention, comprising M identical ADCs, called sub-ADCs. Only the first, second and M:th channels are shown, the rest have been omitted for clarity. Each channel is connected to an input 1 of the ADC, and comprises S/H (sample and hold) means 2, 4, 6 followed in series by a subADC 8, 10, 12. The subADC:s 8, 10, 12 can be any known type of ADC. The S/H means 2, 4, 6 comprise passive sampling means 3, 7, 11 and active holding means 5, 9, 13, and are controlled by a channel clock phase $\Phi_i$, generated by a clock means (not shown) in a manner well known to the man skilled in the art. The channels are connected in parallel to a MUX 14 (multiplexer).

The first sub-ADC 8 samples an input voltage $V_{in}$ supplied on the input 1 of the ADC, on a clock phase $\Phi_1$, the second sub-ADC 10 samples the input voltage $V_{in}$ on clock phase $\Phi_2$, and the M:th sub-ADC 12 samples the input voltage $V_{in}$ on clock phase $\Phi_M$. Assume that the sampling duration for every phase is Ts, and the repetition period for every phase is T. Every sub-ADC converts an analogue sample $S_a$ into a digital sample $S_d$ in a conversion time $T_c$. The digital samples are then combined in the MUX and supplied to an output 16 of the ADC. $T_0$ is given by $$T_c = T - T_s = (M-1) \cdot T_s \qquad (1)$$

where T is the repetition period for every phase, $T_s$ is the sampling duration, and M is the number of sub-ADCs. Though every sub-ADC can only deliver one output every repetition period T, the parallel ADC is capable of delivering the output every sampling duration $T_s = T/M$. Therefore, the speed is increased by M times compared with the sub-ADCs.

As seen in the above discussions, high speed ADCs can be constructed by connecting several lower speed sub-ADCs in parallel. The only high speed part is the passive sampling circuits which need to track and sample the analogue input during the time interval $T_s$.

The sampling instants must be equally spaced between two successive sub-ADCs in order to reconstruct the signal in the digital domain. If a normal distribution of the phase skew is assumed, the relationship between SNDR and the phase skew is given by $$SNDR = 20 \cdot \log\left(\frac{1}{\sigma_t \cdot f_{in}}\right) - 10 \cdot \log\left(\frac{(M-1)4\pi^2}{M}\right) \qquad (2)$$

The problem with the phase skew is that when there is a sampling instant difference, the corresponding sub-ADC samples the wrong analogue value, since the analogue signal is ever-changing. With a given phase skew, the higher the signal frequency, the lower the SNDR.

In order to reduce the phase skew according to the first embodiment of the invention, the S/H means are not only controlled by the channel clock phase $\Phi_i$, but additionally by a global clock phase $\Phi$, also generated by a clock means (not shown) in a manner well known to the man skilled in the art.

According to the first embodiment of the invention, the global clock phase $\Phi$ is used to define the sampling instant in a passive sampling circuit, and yet the sampling of the analogue input takes place in each sub-ADC. The sampling circuit is controlled by the global clock phase $\Phi$ and this defines the sampling instant. When the global clock phase $\Phi$ is high and $\Phi_i$ is also high, the input voltage $V_{in}$ is sampled by the i:th sub-ADC. When the global clock phase $\Phi$ goes low, the analogue value is sampled by the sampling capacitor since one plate of the sampling capacitor is floating. The clock phase $\Phi_i$ always goes low after the global clock phase $\Phi$ goes low. Even if there are large phase skew between successive clock phases $\Phi_i$, they doe not have any influence on the sampling instant and therefore the problem with phase skew is eliminated. However, due to the parasitic capacitance, the charge stored on the sampling capacitor still changes when the analogue input changes even when the clock phase $\Phi$ is low, if the clock phase $\Phi_i$ is not low.

Figure 2:
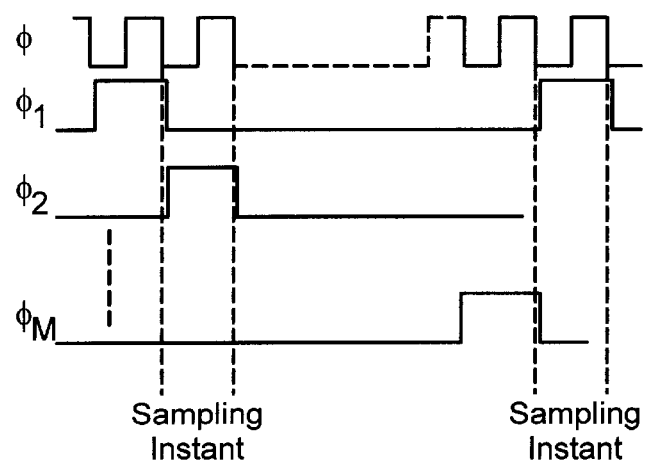
FIG. 2 shows a diagram of clock phases controlling the S/H (sample and hold) means according to the first embodiment of the invention.

FIG. 2 shows a diagram of clock phases controlling the S/H (sample and hold) means 2, 4, 6 according to the first embodiment of the invention. According to the first embodiment of the invention, the repetition frequency of the global clock phase $\Phi$ is M times higher than the repetition frequency of the channel clock phase $\Phi_i$, and the global clock phase $\Phi$ changes state slightly before the channel clock phase $\Phi_i$. If the global clock phase $\Phi$ was to change state after the channel clock phase $\Phi_i$, the effect of having a global clock phase would be lost. The clock phases for the individual sample-and-hold switches, i.e. in the first channel the first and second switches SW1, SW2, are skewed so that none of the individual sample-and-hold switches turn on at the same time, as seen in FIG. 2.

Figure 3:
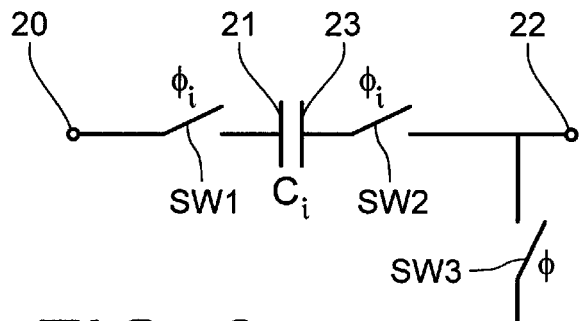
FIG. 3 shows sampling means for one channel of a parallel ADC according to the first embodiment of the invention.

FIG. 3 shows sampling means 3 for one channel of a parallel ADC according to the first embodiment of the invention. A first switch SW1 is connected between an input 20 of the sampling means 3 and a first side 21 of a capacitor $C_i$. A second side 23 of the capacitor $C_i$ is connected via a second switch SW2 to a node 22 of the sampling means 3, said node 22 also being connected via a third switch SW3 to ground. All the sampling means 3, 7, 11 comprised in the S/H means 2, 4, 6 of FIG. 1 are connected in parallel, so that the third switch SW3 is shared by all the channels and controlled by the global clock phase $\Phi$. The channel clock phase $\Phi_i$ controls the first switch SW1 and the second switch SW2. According to the preferred embodiment the switches SW1, SW2, SW3 comprise NMOS transistors, but the switching function could be implemented in a number of ways, well known to the man skilled in the art.

The sampling instant is determined by the turning-off of the third switch SW3 the connects the second side 23 of the sampling capacitor $C_i$ to ground, (and likewise in the other channels). The signal dependency of the turning-off instant, and the errors due to the charge redistribution are eliminated to the first order. This makes an embodiment of the invention very suitable for high dynamic performance ADC:s.

Figure 4:
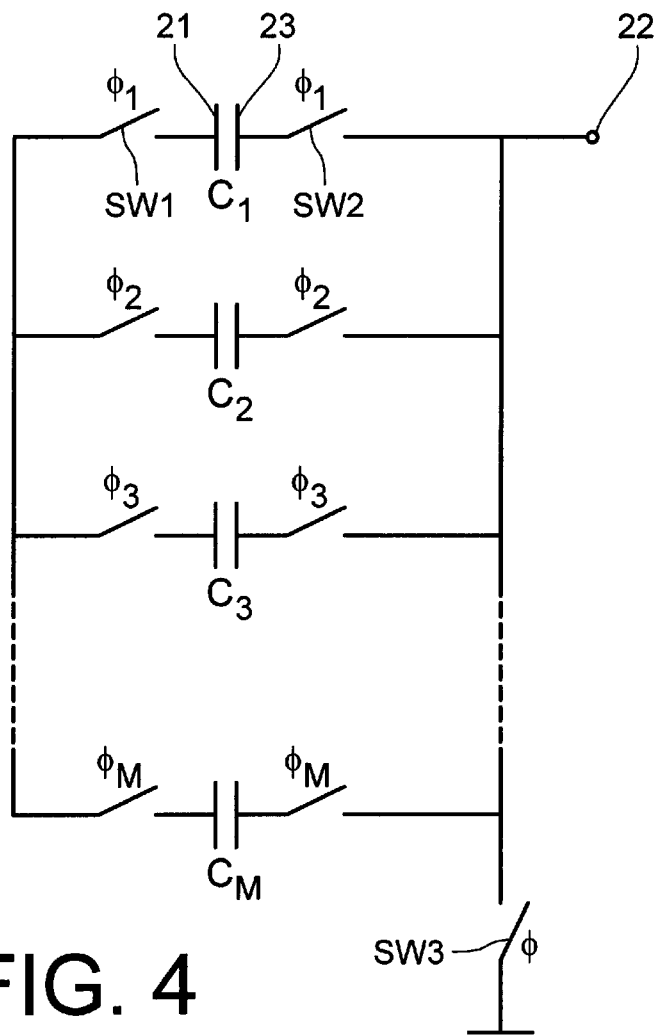
FIG. 4 shows sampling means for an M channel parallel ADC according to the the first embodiment of the invention.

FIG. 4 shows sampling means 3, 7, 11 for an M channel parallel ADC according to the first embodiment of the invention. Each sampling means 3, 7, 11 is built as the one in FIG. 3, and all the sampling means 3, 7, 11 have been connected in parallel to each other. Only a first, second, third and M:th sampling means have been shown, the rest have been omitted for clarity. The first sampling means 3 comprises the first switch SW1, the first capacitor $C_1$ and the second switch SW2, as described in FIG. 3. The second, third and M:th sampling means are correspondingly designed. The third switch SW3 is common to all parallel sampling means.

Figure 5:
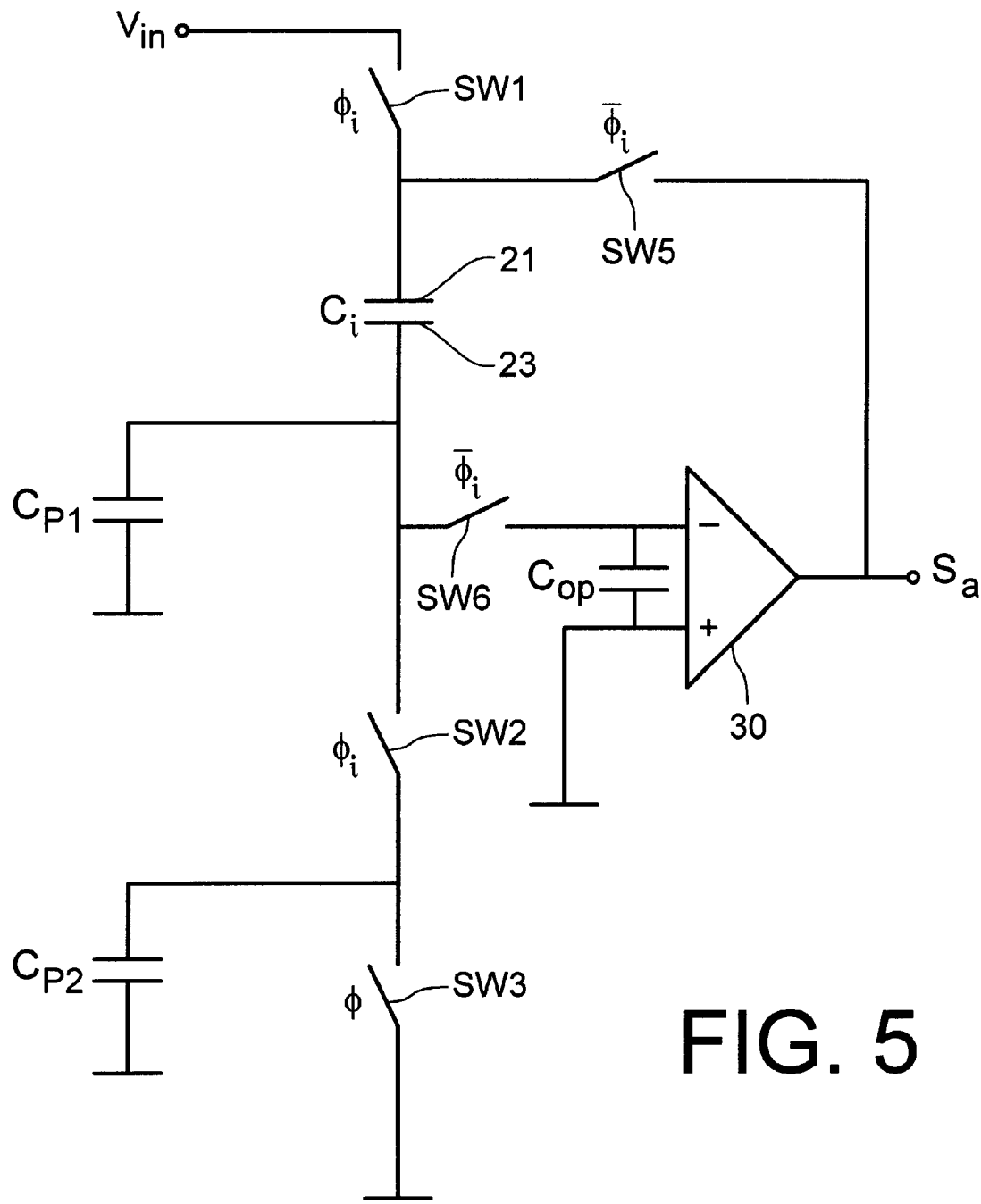
FIG. 5 shows S/H means for one channel of a parallel ADC according to the first embodiment of the invention.

FIG. 5 shows a S/H means for the i:th channel in a parallel ADC according to the first embodiment of the invention. The sampling means 3 is the same as described in connection with FIG. 3 and comprises the first, second and third switches SW1, SW2, SW3 and the sampling capacitor $C_i$. In order for the sub-ADCs to process the sampled analogue value, we need to hold the sampled value. As holding means 5, one operational amplifier 30 is used for each sub-ADC in each channel. This is accomplished by letting the sampling capacitor $C_i$ be switched into the feedback loop of the operational amplifier 30. A fifth and sixth switch SW5, SW6 are added on either side of the sampling capacitor $C_i$. In this way, the first side 21 of the sampling capacitor $C_i$ is connected via the fifth switch SW5 to the output 32 of the amplifier 30 and the second side 23 of the sampling capacitor $C_i$ is connected via the sixth switch SW6 to the inverting input 34 of the amplifier 30, the non-inverting input 36 is grounded.

The clock phases are shown in FIG. 2. Referring now also to FIG. 5, when the channel clock phase $\Phi_i$ is high and the global clock phase $\Phi$ is high, the first, second and third switches SW1, SW2, SW3 are closed, the operational amplifier 30 is disconnected as the fifth and sixth switches SW5, SW6 are opened, and the capacitor $C_i$ samples the analogue input voltage $V_{in}$. Then the global clock phase $\Phi$ is low and the third switch SW3 is opened. This is the sample phase. When the channel clock phase $\Phi_i$ is low, i.e. on the clock phase $\Phi_i$, the first and second switches SW1, SW2 are opened, the fifth and sixth switches SW5, SW6 are closed and the capacitor $C_i$ is connected in negative feedback to the operational amplifier. This is the hold phase.

Included in FIG. 5 are parasitic capacitances $C_{p1}$ of the second side 23 plate of the sampling capacitance $C_i$, $C_{p2}$ between the second and third switches SW2, SW3 and an input capacitance $C_{op}$ of the operational amplifier all of which would have to be considered when designing a circuit implementation according to the invention. Using the sampling technique according to the invention, an error is introduced due to these parasitic capacitances. When the sampling technique according to the invention is applied to a parallel ADC, mismatch between the parasitics of different channels will introduce distortion. This leads to the fact that with a method and a device according to the invention, the effect of phase skew errors is not completely removed, but it is reduced by a factor $$\frac{1}{a} = \frac{C_{p1} + C_{p2} + C_i}{C_{p2}}$$

Assuming the time instant when the sampling switch, that is the third switch SW3 is opened, is denoted t and the instant when the second switch SW2 is opened is denoted t+τ. The charge stored on $C_{p2}$ will cause a signal dependent error on the output signal. At the time instance t, the total charge on the second side 23, i.e. the right hand plate node of $C_i$ is $$q(t)=q_{c_i}(t)+q_{c_{p1}}(t)+q_{c_{p2}}(t)=-C_i V_{in}(t)+0+0=-C_i V_{in}(t) \quad (3)$$

At time instance t+τ when the second switch SW2 is opened, the total charge on the right hand plate of the sampling capacitor $C_i$ is given by $$q(t+\tau)=q_{c_i}(t+\tau)+q_{c_{p1}}(t+\tau)+q_{c_{p2}}(t+\tau)=(V_2(t+\tau)-V_{in}(t+\tau))\cdot C_i+V_2(t+\tau)\cdot(C_{p1}+C_{p2}) \quad (4)$$

Due to the charge conversation, (3) and (4) should be equal to each other. Therefore, we have a voltage $V_2$ across the parasitic capacitors at t+τ given by $$V_2(t+\tau) = (V_{in}(t+\tau) - V_{in}(t)) \cdot \frac{C_i}{C_{p1} + C_{p2} + C_i} \quad (5)$$

The charge stored on $C_{p2}$ is given by $$q_{c_{p2}}(t+\tau) = C_{p2} \cdot V_2(t+\tau) \quad (6)$$
$$= (V_{in}(t+\tau) - V_{in}(t)) \cdot \frac{C_i \cdot C_{p2}}{C_{p1} + C_{p2} + C_i}$$

After the second switch SW2 opens, the charge stored on $C_{p2}$ will be lost while all the charge stored on the sampling capacitor $C_i$ and the parasitic $C_{p1}$ will be transferred during the hold phase when an operational amplifier is used. Such a configuration is shown in FIG. 5.

Assuming an ideal operational amplifier, all the charge stored on the sampling capacitor $C_i$ and the parasitic $C_{p1}$ will be completely transferred. The only error source is due to the lost charge stored on $C_{p2}$ at t+τ. Therefore a analogue output voltage $V_{out}$ after the sampling is given by $$V_{out} = -\frac{q(t+\tau) - q_{C_{p3}}(t+\tau)}{C_1} \quad (7)$$
$$= V_{in}(t) \cdot (1-a) + a \cdot V_{in}(t+\tau)$$

$$a = \frac{C_{p2}}{C_{p1} + C_{p2} + C_i} \quad (8)$$

Assume there are M parallel channels and that the third switch SW3 controlled by the clock phase $\Phi$ opens at time instants $$T_s \cdot n, \; n=0, \ldots, \infty \quad (9)$$

and that the second switch SW2 in channel i (i=1, 2, ..., M) controlled by the clock phase $\Phi_i$ opens at $$(i-1)\cdot T_s + n\cdot M\cdot T_s + \tau + t_{skew,i}, \; n=0, \ldots, \infty, \; i=1, 2, \ldots, M \quad (10)$$

where $T_s$ is the average sampling period, τ is the average delay between the turn off of the third switch SW3 and the second switch SW2 in the i:th channel and $t_{skew,i}$ is the relative clock skew of clock phase $\Phi_i$.

If the parasitic capacitors and sampling capacitors for all the channels are assumed to be equal, i.e. the factor a is equal for all the channels, and the time skews are assumed to be independent random variables with normal distribution and variance $\sigma_t^2$ the SNDR can be approximated as $$SNDR = 20 \cdot \log\left(\frac{1}{\sigma_t \cdot f_{in}}\right) - \quad (11)$$
$$10 \cdot \log\left(\frac{(M-1)4\pi^2}{M}\right) - 20 \cdot \log(a)$$

for small a and $f_{in}\tau$, where $f_{in}$ is the input signal frequency.

From equation (11) it is seen that with parasitic capacitors the effect of phase skew errors is not completely removed but it is reduced by a factor $$\frac{1}{a}$$

compared to SNDR in parallel ADCs using the ordinary sampling techniques given by equation (2).

According to the invention, sampling is passive and therefore very high speed sampling is attainable, and holding is active, but the time for the operational amplifier to settle is M−1 times longer than the sampling time (M is the number of channels) and thus the speed requirements of the operational amplifier is not high. Hence the S/H circuit of FIG. 5 is very suitable for high speed parallel ADCs.

For a 2-channel parallel ADC, one operational amplifier can be shared by both channels. This sharing technique can naturally be used in an ADC according to the invention. An M channel ADC could consequently use one operational amplifier for every two channels. The holding means 5, 9, 13, which according to the embodiment described above comprise an operational amplifier per channel, could thus be conceived as one holding means common to two channels, comprising an operational amplifier, or a holding means common to all channels, comprising at least one operational amplifier per two channels.

The embodiment described above shows the inventive concept as applied to a single ended device, but it is equally applicable to a fully differentialized system.

It is also understood that the embodiments above are given as a non-exclusive example, and that other embodiments within the scope of the invention may be envisaged by the man skilled in the art.

What is claimed is:

1. A parallel analog-to-digital converter having a number of parallel channels between an input terminal and a multiplexer, each channel having sampling means controlled by a channel clock phase to in turn sample a signal on the input terminal, and converter means connected between the sampling means and the multiplexer to convert samples from the sampling means, wherein a switch, common to all channels, is connected in series with the respective sampling means to ground, the switch being controlled by a global clock phase adapted to change its state slightly before the respective channel clock phase changes its state to provide samples to the converter means.

2. A parallel analog-to-digital converter according to claim 1, wherein the repetition frequency of the global clock phase is M times higher than the repetition frequency of the channel clock phase.

3. A parallel analog-to-digital converter according to claim 2, wherein the global clock phase changes state slightly before the channel clock phase.

4. A parallel analog-to-digital converter according to claim 3, further comprising active holding means.

5. A parallel analog-to-digital converter according to claim 4, wherein said active holding means comprises at least one operational amplifier.

6. A parallel analog-to-digital converter according to claim 4, wherein said sampling means comprises at least one capacitor included in a feedback loop of said holding means.

7. A method for parallel analog-to-digital conversion using a number of parallel channels between an input terminal and a multiplexer, comprising the steps of:
sampling, in each channel, of a signal on the input terminal, under the control of a channel clock phase; and
converting the samples before they are input to the multiplexer, wherein said sampling in each channel is controlled by, in addition to the channel clock phase a switch common to all channels, the switch being controlled by a global clock phase adapted to change its state slightly before the respective channel clock phase changes its state to provide samples for the conversion.

8. A method for parallel analog-to-digital conversion according to claim 7, wherein the repetition frequency of the global clock phase is M times higher than the repetition frequency of the channel clock phase.

9. A method for parallel analog-to-digital conversion according to claim 8 wherein the global clock phase changes state slightly before the channel clock phase.

10. A method for parallel analog-to-digital conversion according to claim 9, wherein said sampling is capacitive.

11. A method for sampling an analog signal in parallel using a number of parallel channels between an input terminal and a multiplexer, comprising switching capacitors in each channel controlled by a channel clock phase to in turn sample a signal on the input terminal, wherein said switching is executed depending on a global clock phase adapted to change its state slightly before the respective channel clock phase changes its state to provide samples for conversion.

12. A method for sampling according to claim 11, wherein the repetition frequency of the global clock phase is M times higher than the repetition frequency of the channel clock phase.

13. A method for sampling according to claim 12, wherein the global clock phase changes state slightly before the channel clock phase.

* * * * *